United States Patent
Oh et al.

(10) Patent No.: US 9,349,993 B2
(45) Date of Patent: May 24, 2016

(54) FILM FOR IMPROVING COLOR DISPLAY AND METHOD FOR MANUFACTURING THE SAME, AND DISPLAY APPARATUS INCLUDING IMPROVED COLOR DISPLAY FILM

(71) Applicant: Samsung Electronics Co., Ltd., Suwon-Si, Gyeonggi-Do (KR)

(72) Inventors: Young Oh, Uiwang-si (KR); Hyun-Min Kim, Uiwang-si (KR); Seung-Man Choi, Uiwang-si (KR); You-Min Shin, Gyeongsangbuk-do (KR); Hong-shik Shim, Seoul (KR); Chul-Ho Jeong, Gwangju-si (KR); Eun-Young Cho, Gyeongsangbuk-do (KR)

(73) Assignees: Samsung Electronics Co., Ltd., Gyeonggi-do (KR); Samsung Corning Precision Materials Co., Ltd., Chungcheongnam-do (KR); Cheil Industries Inc., Gyeongsangbuk-do (KR)

( * ) Notice: Subject to any disclaimer, the term of this patent is extended or adjusted under 35 U.S.C. 154(b) by 0 days.

(21) Appl. No.: 14/200,719

(22) Filed: Mar. 7, 2014

(65) Prior Publication Data
US 2014/0252330 A1 Sep. 11, 2014

(30) Foreign Application Priority Data

Mar. 8, 2013 (KR) .................. 10-2013-0025315
May 31, 2013 (KR) .................. 10-2013-0063030

(51) Int. Cl.
*H01L 51/52* (2006.01)
*G02B 3/00* (2006.01)
*G02B 5/02* (2006.01)

(52) U.S. Cl.
CPC ............ *H01L 51/5275* (2013.01); *G02B 3/005* (2013.01); *G02B 3/0056* (2013.01);
(Continued)

(58) Field of Classification Search
CPC .. H01L 51/5275; G02B 3/005; G02B 3/0056; G02B 3/0068; G02B 5/0236; G02B 5/0242; G02B 5/0278; Y10T 428/24521
See application file for complete search history.

(56) References Cited

U.S. PATENT DOCUMENTS 5,995,288 A    11/1999  Kashima et al.
6,319,594 B1 * 11/2001  Suzuki et al. ................. 428/208
(Continued)

FOREIGN PATENT DOCUMENTS

JP    2007264113 A    10/2007
JP    20090036910      2/2009
(Continued)

OTHER PUBLICATIONS

Extended European Patent Office Search Report dated Jun. 26, 2014 for corresponding European Application No. 14158035.7.

*Primary Examiner* — Khaja Ahmad
(74) *Attorney, Agent, or Firm* — Harness, Dickey & Pierce, P.L.C.

(57) ABSTRACT

Provided are a color display film, a method for manufacturing the same, and a display apparatus including the color display film. The color display film includes a base material layer, a high-refractive light diffusion layer including a light diffuser, a high-refractive resin layer, and a low-refractive resin layer on which an optical pattern is formed. The method for manufacturing a color display film includes forming a high-refractive light diffusion layer by coating a resin comprising a diffuser on one surface of a base material layer and hardening the resin, forming a high-refractive resin layer, in which optical patterns are formed, on one surface of the high-refractive light diffusion layer, and forming a low-refractive resin layer having optical patterns formed on one surface thereof by coating a low-refractive transparent resin on a surface of the high-refractive resin layer in which the optical patterns are formed and hardening the resin.

20 Claims, 6 Drawing Sheets

(52) U.S. Cl.
CPC ............ *G02B3/0068* (2013.01); *G02B 5/0236* (2013.01); *G02B 5/0242* (2013.01); *G02B 5/0278* (2013.01); *Y10T 428/24521* (2015.01)

(56) References Cited

U.S. PATENT DOCUMENTS

| | | | |
|---|---|---|---|
| 2006/0209403 A1* | 9/2006 | Parusel et al. | 359/453 |
| 2007/0035839 A1* | 2/2007 | Ibuki | 359/582 |
| 2007/0146887 A1* | 6/2007 | Ikeda et al. | 359/586 |
| 2009/0066219 A1* | 3/2009 | Handa et al. | 313/503 |
| 2009/0128738 A1* | 5/2009 | Matsumoto et al. | 349/64 |
| 2009/0284686 A1 | 11/2009 | Joo et al. | |
| 2010/0097705 A1* | 4/2010 | Furui et al. | 359/599 |
| 2011/0256312 A1* | 10/2011 | Suzuki et al. | 427/164 |
| 2012/0176572 A1 | 7/2012 | Park et al. | |
| 2012/0307191 A1 | 12/2012 | Park et al. | |

FOREIGN PATENT DOCUMENTS

| | | |
|---|---|---|
| KR | 20080055699 A | 6/2008 |
| KR | 20110065610 A | 6/2011 |
| KR | 10120070 A | 7/2012 |

* cited by examiner

FILM FOR IMPROVING COLOR DISPLAY AND METHOD FOR MANUFACTURING THE SAME, AND DISPLAY APPARATUS INCLUDING IMPROVED COLOR DISPLAY FILM

RELATED APPLICATIONS

This application claims priority from Korean Patent Application No. 10-2013-0025315, filed on Mar. 8, 2013, and Korean Patent Application No. 10-2013-0063030, filed on May 31, 2013, in the Korean Intellectual Property Office, the disclosures of which are incorporated herein in their entirety by reference.

BACKGROUND

1. Field

At least one example embodiment of the present disclosure relates to a film for improving color display and/or a method for manufacturing the same, and more particularly, to an improved color display film having a small change in color display according to a viewing angle and/or a method for manufacturing the same, and/or a display apparatus including the improved color display film.

2. Description of the Related Art

In liquid crystal light-emitting devices, a panel in which liquid crystals for realizing a screen are regularly arranged in tempered flat glass may be disposed, and a backlight may emit light into the panel to display colors and images on the screen.

Such a liquid crystal light-emitting device typically has high image quality and low manufacturing costs. However, the liquid crystal light-emitting device may have a complex manufacturing process, a relatively low response speed, a narrow viewing angle, and high power consumption.

Organic light-emitting diode displays (OLEDs) are typically considered next generation displays for complementing the above-described faults of the liquid crystal displays (LCDs). Such an OLED may have a light-emitting property in which light is emitted when current is applied to a fluorescent organic compound. Thus, the OLED may display colors by using characteristics in which red (R), green (G), and blue (B) colors are displayed according to organic materials. The OLED may have high resolution, wide viewing angle, low power consumption, and fast response speed to display natural images without the disadvantage of afterimages. Thus, the OLED is being widely used for portable devices and general digital televisions.

Korean Patent Publication No. 2012-0081362 discloses a structure including a background layer that is layered to improve a change in color display according to a viewing angle of an LCD.

SUMMARY

At least one example embodiment includes a color display film having a small change in color display according to a viewing angle.

Provided is an example color display film having superior light transmittance and diffusion.

At least one example embodiment includes a method for manufacturing a color display film having superior processability and economic feasibility.

Provided is an example display apparatus including a color display film.

Additional examples embodiments will be set forth in part in the description which follows and, in part, will be apparent from the description, or may be learned by practice of the presented embodiments.

According to an example embodiment, a color display film includes: a base material layer; a high-refractive light diffusion layer including a light diffuser; a high-refractive resin layer; and a low-refractive resin layer on which an optical pattern is formed, wherein the base material layer, the high-refractive light diffusion layer, the high-refractive resin layer, and the low-refractive resin layer are sequentially stacked.

In at least one example embodiment, the optical pattern is formed on one surface of the low-refractive resin layer facing the high-refractive resin layer.

Each of the high-refractive light diffusion layer and the high-refractive resin layer may include an ultraviolet hardening transparent resin having a refractive index of about 1.50 to about 1.60.

The low-refractive resin layer may include an ultraviolet hardening transparent resin having a refractive index of about 1.35 to about 1.45.

The optical pattern and the low-refractive resin layer may be one body.

The high-refractive light diffusion layer including the light diffuser and the high-refractive resin layer may be integrally formed with each other.

The optical pattern may be constituted by a plurality of lenticular lenses, and each of the lenticular lenses may have a width (D) of about 1 μm to about 1,000 μm, a height (H) of about 1 μm to about 2,000 μm, and an aspect ratio (H/D) of about 0.2 to about 3.0.

The plurality of lenticular lenses may have a spaced distance L therebetween, and a ratio (L/D) of the spaced distance (L) to the width (D) may be about 3.0 or less.

Each of the high-refractive resin layer and the low-refractive resin layer may be an ultraviolet hardening transparent resin having an acrylate-based functional group.

The light diffuser may be one of an organic-based light diffuser, an inorganic-based light diffuser, and a mixture thereof.

The organic-based light diffuser may include at least one selected from the group consisting of acrylic-based particles, siloxane-based particles, melamine-based particles, polycarbonate-based particles, and styrene-based particles.

The inorganic-based light diffuser may include at least one selected from the group consisting of calcium carbonate, barium sulfate, titanium dioxide, aluminum hydroxide, silica, glass, talcum, mica, white carbon, magnesium oxide, and zinc oxide.

The organic-based light diffuser may have a particle size of about 1 μm to about 20 μm.

The organic-based light diffuser may include polymer particles that are coated with a black dye and non-coated particles, the polymer particles that are coated with black dye may be poly methyl methacrylate (PMMA) particles, and the non-coated particles may be one of silicon particles, acrylic-based particles, and a mixture thereof.

The organic-based light diffuser may include the polymer particles that are coated with black dye and the non-coated particles, which are mixed at a weight ratio of about 1:4 to about 4:1.

The high refractive light diffusion layer may contain the light diffuser at a concentration of about 0.1 weight % to about 10 weight %.

The base material layer may have a thickness of about 30 μm to about 100 μm, the high-refractive light diffusion layer may have a thickness of about 5 μm to about 60 μm, the high-refractive resin layer may have a maximum thickness of about 5 μm to about 80 μm, and the low-refractive resin layer may have a thickness of about 5 μm to about 50 μm.

An adhesive layer may be further stacked on the other surface of the low-refractive resin layer.

The base material layer may include one of triacetate cellulose (TAC), polyethylene terephthalate (PET), polycarbonate (PC), and polyvinyl chloride (PVC).

According to another example embodiment, a method for manufacturing a color display film includes: forming a high-refractive light diffusion layer by coating a resin comprising a diffuser on one surface of a base material layer and hardening the resin, forming a high-refractive resin layer, in which a plurality of optical patterns are imprinted or formed, on one surface of the high-refractive light diffusion layer, and forming a low-refractive resin layer having optical patterns formed on one surface thereof by coating a low-refractive transparent resin on a surface of the high-refractive resin layer in which the optical patterns are imprinted or formed and hardening the resin.

The example method may further include applying an adhesive on the other surface of the low-refractive resin layer to form an adhesive layer.

According to another example embodiment, an organic light-emitting device display apparatus includes: a first electrode; a second electrode facing the first electrode; an organic light emission film disposed between the first electrode and the second electrode; and a color display film disposed on a light emission surface of the second electrode, wherein the color display film is the color display film discussed above, and the organic light-emitting device display apparatus has a resonant structure to display an image by using a color reflected from each pixel of the organic light emission film.

The organic light emission film may include a hole injection layer (HIL), a hole transport layer (HTL), an emission layer (EML), an electron transport layer (ETL), and an electron injection layer (EIL), which are sequentially stacked.

BRIEF DESCRIPTION OF THE DRAWINGS

These and/or other example embodiments will become apparent and more readily appreciated from the following description of the embodiments, taken in conjunction with the accompanying drawings in which.

DETAILED DESCRIPTION

Reference will now be made in detail to example embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain example embodiments of the present description. Expressions such as "at least one of," when preceding a list of elements, modify the entire list of elements and do not modify the individual elements of the list.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

Hereinafter, an example color display film and an example method for manufacturing the same, and a display apparatus including the color display film according to an example embodiment will be described in detail with reference to the accompanying drawings. In the drawings, the thicknesses of lines and sizes of elements are exaggerated for clarity and convenience.

Also, terms used in this specification are terms defined in consideration of functions according to embodiments, and thus the terms may be changed according to the intension or usage of a user or operator. Therefore, the terms should be defined on the basis of the overall contents of this specification.

First, a color display film according to example embodiments will be described.

Color Display Film

Figure 1:
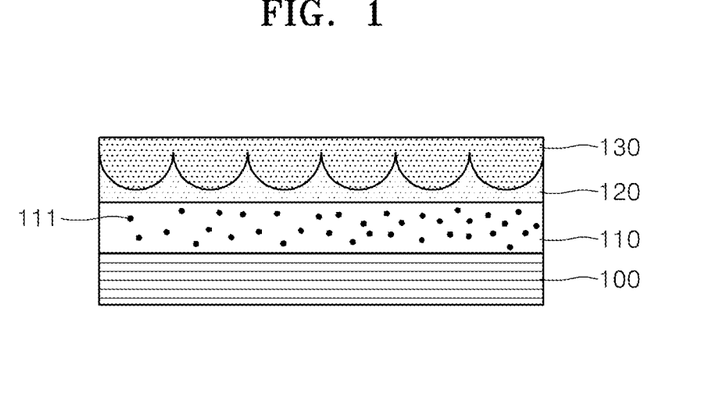
FIG. 1 is a cross-sectional view of a color display film according to an example embodiment.

FIG. 1 is a cross-sectional view of a color display film according to an example embodiment.

According to at least one example embodiment, referring to FIG. 1, a color display film includes a base material layer 100, a high-refractive light diffusion layer 110 containing a light diffuser, a high-refractive resin layer 120, and a low-refractive resin layer 130 on which an optical pattern is formed. The base material layer 100, the high-refractive light diffusion layer 110, the high-refractive resin layer 120, and the low-refractive resin layer 130 may be sequentially stacked. The color display film has a structure in which the optical pattern is formed on one surface of the low-refractive resin layer 130 facing the high-refractive resin layer 120. The base material layer 100 may be a transparent resin film or glass substrate having an ultraviolet (UV) light transmission, a light incident surface and a light emission surface facing the light incident surface. The base material layer 100 may be formed of triacetate cellulose (TAC), polyethylene terephthalate (PET), polycarbonate (PC), or polyvinyl chloride (PVC). The base material layer 100 may be a single layer or a multi layer. The base material layer 100 may have a thickness of about 30 μm to about 100 μm. The high-refractive light diffusion layer 110 may be stacked on the light incident surface of the base material layer 100. The high-refractive light diffusion layer 110 may be formed of a light diffuser 111 and a UV hardening transparent resin which is hardened by UV. The UV hardening transparent resin has a refractive index of about 1.50 to about 1.60. The high-refractive light diffusion layer 110 may have a thickness of about 5 μm to about 60 μm.

According to at least one example embodiment, an organic-based light diffuser or an inorganic-based light diffuser may be used as the light diffuser 111 contained in the high-refractive light diffusion layer 110. Alternatively, the organic-based light diffuser and the inorganic-based light diffuser may be mixed with each other to improve diffusion and transmission. One of acrylic-based particles, siloxane-based particles, melamine-based particles, polycarbonate-based particles, and styrene-based particles, or a mixture thereof may be used as the organic-based light diffuser. The organic-based light diffuser may include linking particles, each of which is spherical and has an average particle size of about 1 μm to about 20 μm. The inorganic-based light diffuser may be added to reduce or alternatively prevent a whiteness index of a final resin compound from being reduced when the spherical organic-based light diffuser is added and increase light diffusion. In this case, since processability is reduced as an added amount of inorganic-based light diffuser increases, an adequate amount of inorganic-based light diffuser may be added. For example, calcium carbonate, barium sulfate, titanium dioxide, aluminum hydroxide, silica, glass, talcum, mica, white carbon, magnesium oxide, zinc oxide, and the like may be used as the inorganic-based light diffuser, but the present disclosure is not limited thereto.

According to at least one example embodiment, the organic-based light diffuser may have a particle size of about 1 μm to about 20 μm, for example, about 1 μm to about 10 μm, or about 2 μm to about 5 μm.

The organic-based light diffuser may include polymer particles that are coated with a black dye. However, when the polymer particles that are coated with the black dye are used alone, light transmittance may be reduced, thereby reducing brightness. Thus, silicon particles, acrylic-based particles, or a mixture thereof may be further added as non-coated particles. That is, the polymer particles that are coated with the black dye and the non-coated polymer particles may be mixed with a proper amount to adjust brightness, a change in color difference according to a viewing angle, a contrast ratio, and a reflective color. For example, poly methyl methacrylate (PMMA) particles that are coated with the black dye and the non-coated polymer particles (silicon particles, acrylic-based particles, or a mixture thereof) which are mixed at a weight ratio of about 1:4 to about 4:1, may be used as the light diffuser.

In a case where the optical pattern is a lenticular lens pattern, color display improvement of the panel in a horizontal direction may be achieved. However, it may be difficult to obtain satisfactory effects due to a shape of the lenticular lens that is arranged in a vertical direction. If the light diffuser 111 according to an example embodiment is applied, the color sense improvement in the horizontal and vertical directions may be achieved.

According to at least one example embodiment, the high-refractive light diffusion layer 110 may contain the light diffuser 111 of about 0.1 weight % to about 10 weight %. The high-refractive resin layer 120 may be formed between the high-refractive light diffusion layer 110 and the low-refractive resin layer 130 on which the optical pattern facing the high-refractive light diffusion layer 110 is formed. The high-refractive resin layer 120 may be formed of a UV hardening transparent resin having a refractive index of about 1.50 to about 1.60. The high-refractive resin layer 120 may have a non-uniform thickness when the surface of the optical pattern formed on the low-refractive resin layer 130 is uneven. The high-refractive resin layer 120 may have a maximum thickness of about 5 μm to about 80 μm.

Figure 5:
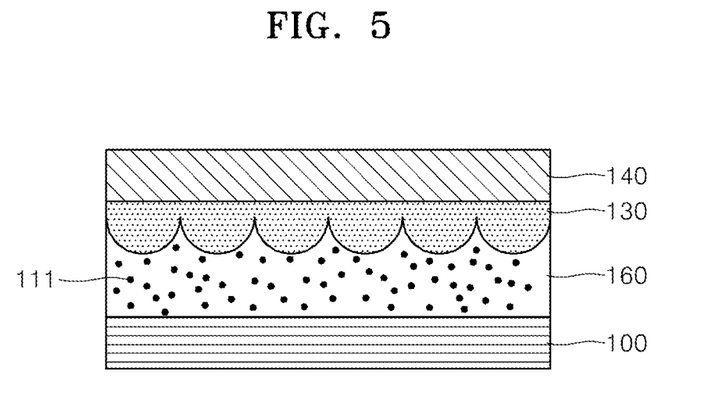
FIG. 5 is a cross-sectional view of a color display film according to another example embodiment.

Referring to FIG. 1, the high-refractive light diffusion layer 110 including the light diffuser 111 and the high-refractive resin layer 120 may be separately manufactured. However, as illustrated in FIG. 5, according to at least one example embodiment, the high-refractive light diffusion layer 110 and the high-refractive resin layer 120 may be integrally formed with each other to form one layer 160. That is, the high-refractive light diffusion layer 110 and the high-refractive resin layer 120 may be one body illustrated as layer 160.

Figure 2:
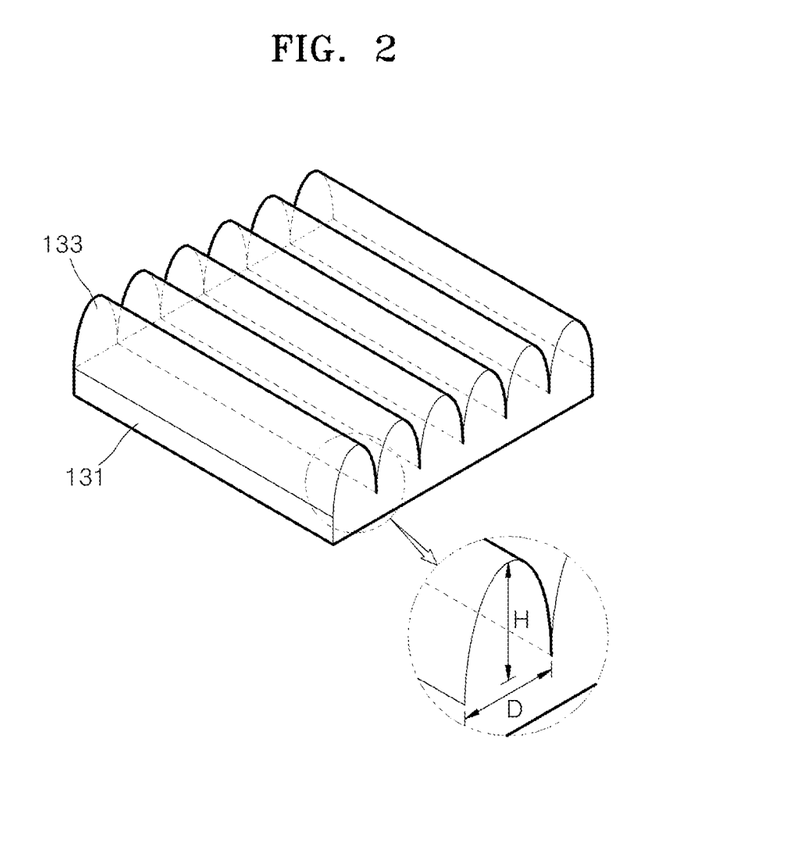
FIG. 2 is a perspective view of a low-refractive resin layer on which a lenticular lens pattern is formed as an optical pattern according to an example embodiment.

As described in FIG. 2, according to at least one example embodiment, the low-refractive resin layer 130 on which the optical pattern is formed may include a first low-refractive resin layer 131 and a plurality of optical patterns 133 formed on one surface of the first low-refractive resin layer 131. The optical patterns 133 may be formed on one surface of the first low-refractive resin layer 131 facing the high-refractive resin layer 120.

The first low-refractive resin layer 131 and the optical patterns 133 may be integrally formed with each other by using the same material without using an adhesive. That is, the first low-refractive resin layer 131 and the optical patterns 133 may be one body. Each of the optical patterns 133 and the first low-refractive resin layer 131 may be formed of a UV hardening transparent resin having a refractive index of about 1.35 to about 1.45. Also, the optical patterns 133 and the first low-refractive index resin layer 131 may be integrally formed with each other. Alternatively, the first low-refractive resin layer 131 and the optical patterns 133 may be two separate bodies brought together via an adhesive.

Each of the optical patterns 133 may have at least one shape selected from the group consisting of a cone, a cone frame, a micro lens, a cylinder lens, a prism, and a round prism, but is not limited thereto. Light having high color purity incident into the panel may be emitted in a direction perpendicular to a direction of the light emission surface. For example, a micro lens may be used to more widely diffuse the incident light having high color purity. The micro lens may have one of a semicircular sectional lenticular pattern shape, a semicircular sectional dot pattern shape, a semicircular sectional strip pattern shape, and a semicircular sectional wave pattern shape, but is not limited thereto.

FIG. 2 is a perspective view of the low-refractive resin layer 131 on which the optical pattern 133 is formed according to an example embodiment. In FIG. 2, the semicircular sectional lenticular pattern may be an example of the optical pattern 133.

Referring to FIG. 2, the plurality of optical patterns 133 are formed on one surface of the first low-refractive resin layer 131. The optical patterns 133 and the first low-refractive resin layer 131 may be integrally formed with each other. Each of the optical patterns 133 may be a lenticular lens. Hereinafter, for convenience of description, the optical pattern 133 will be called a lenticular lens. The lenticular lens 133 may have a width D of about 1 μm to about 1,000 μm and a height H of about 1 μm to about 2,000 μm. Also, the lenticular lens 133 may have an aspect ratio H/D of about 0.2 to about 3.0, for example, about 0.3 to about 1. The first low-refractive resin layer 131 may have a thickness of about 5 μm to about 50 μm.

To obtain the improved color display effect, it may be advantageous to use a lens having a high aspect ratio. However, it may be difficult to perform bite processing or roll processing using a bite. In addition, in consideration of mass production, yield may be significantly reduced to deteriorate economic feasibility. According to an example embodiment, the improved color display effect may be realized by applying the high-refractive light diffusion layer event though the optical pattern having a relatively small aspect ratio is used.

Figure 3:
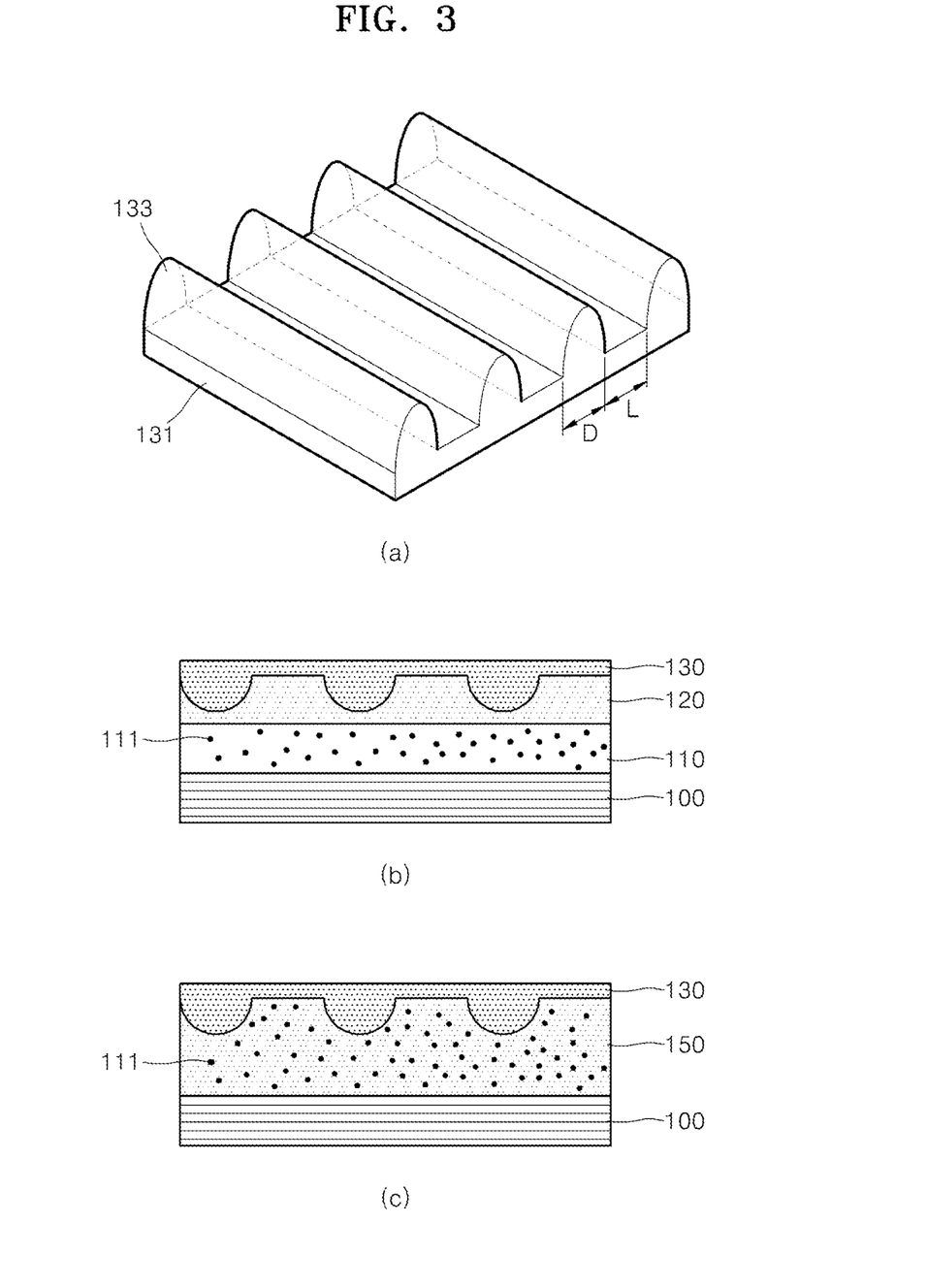
FIG. 3A is a perspective view of a low-refractive resin layer on which a lenticular lens pattern of which lenticular lenses adjacent to each other are spaced by a desired (or, alternatively, predetermined) distance from each other is formed.
FIGS. 3B and 3C are cross-sectional views of a color display film including the low-refractive resin layer.

FIG. 3A is a perspective view of a lenticular lens pattern according to another example embodiment.

According to at least one example embodiment, referring to FIG. 3A, in a lenticular lens pattern according to another embodiment, a plurality of lenticular lenses 133 may be arranged with a constantly spaced distance L between adjacent lenticular lenses. A ratio L/D of the spaced distance L to the width D of the lenticular lens 133 may be less than about 3.0. For example, the ratio L/D may range from about 1.0 to about 2.0. In this range, the improved color display effect according to the viewing angle may be maximized.

FIG. 3B is a cross-sectional view of the color display film on which the lenticular lens pattern is formed according to another example embodiment, and FIG. 3C is a cross-sectional view of the color display film in which the high-refractive light diffusion layer and the high-refractive resin layer are integrally formed with each other.

According to at least one example embodiment, referring to FIG. 3C, the color display film on which the lenticular lens pattern is formed may be a color display film on which the high-refractive light diffusion layer and the high-refractive resin layer (illustrated as layers 110 and 120, respectively, in FIG. 3B) are formed as one layer 150.

A UV hardening transparent resin as a transparent polymer resin may be used as a basic resin for the high-refractive light diffusion layer 110, the high-refractive resin layer 120 and the low-refractive resin layer 130 on which the optical patterns of FIG. 1 are formed, according to at least one example embodiment.

A resin having an acrylate-based functional group, for example, a polyester resin, a polyether resin, an acrylic resin, an epoxy resin, a urethane resin, an alkyd resin, a spiroacetalg resin, a polybutadiene resin, a poly-thiol polyene resin, and a (meth)acrylate resin of a polyfunctional compound such as polyhydric alcohol, having a relatively small molecular weight may be used as the UV hardening transparent resin.

Examples of the UV hardening transparent resin may include ethylene glycol diacrylate, neopentyl glycol di(meth) acrylate, 1,6-hexanediol(meth)acrylate, trimethyol propane tri(meth)acrylate, di-pentaerythritol hexa(meth)acrylate, polyolpoly(meth)acrylate, di(meth)acrylate of bis phenol A-diglycidyl ether, polyester(meth)acrylate that is obtained by esterifying polyhydric alcohol, polyhydric carboxylic acid, and an anhydride thereof, and acrylic acid, polysiloxane poly acrylate, urethane(meth)acrylate, pentaerythritol tetramethacrylate, and glyceryl tri methacrylate, but is not limited thereto.

Figure 4:
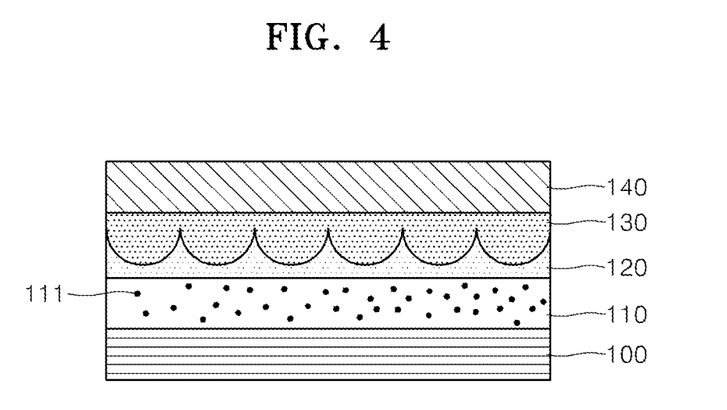
FIG. 4 is a cross-sectional view of a color display film according to another example embodiment.

FIG. 4 illustrates a color display film according to another example embodiment.

According to at least one example embodiment, referring to FIG. 4, an adhesive layer 140 may be further stacked on the low-refractive resin layer 130. For example, a general adhesive may be provided as the adhesive layer 140.

The color display films according to the forgoing embodiments may have the above-described structural feature. Thus, the color display films may have a small change in white angle dependency (WAD) according to a viewing angle, and thus, the WAD according to the viewing angle may be uniformly used.

Method for Manufacturing Color Display Film

A method for manufacturing a color display film according to an example embodiment may include a process of sequentially stacking a base material layer, a high-refractive light diffusion layer, a high-refractive resin layer, and a low-refractive resin layer on which an optical pattern is formed.

The example method will be described with reference to FIG. 1. The example method for manufacturing the color display film includes a process of forming a high-refractive light diffusion layer 110 by coating a resin including a diffuser 111 on one surface of a base material layer 100 and hardening the resin, a process of forming a high-refractive resin layer 120, in which a plurality of optical patterns are imprinted or formed, on one surface of the high-refractive light diffusion layer 110, and a process of forming a low-refractive resin layer 130, on which the optical patterns are formed on one surface thereof, by coating a low-refractive transparent resin on a surface of the high-refractive resin layer 120 in which the optical patterns are imprinted or formed and hardening the resin.

As illustrated in FIG. 4, a method for manufacturing a color display film according to another example embodiment may further include a process of applying an adhesive on the other surface of the low-refractive resin layer 130 to form an adhesive layer 140.

A UV hardening transparent resin may be used as the transparent resin. The high-refractive transparent resin layer 120 may have a refractive index of about 1.50 to about 1.60, and the low-refractive transparent resin may have a refractive index of about 1.35 to about 1.45.

The high-refractive light diffusion layer 110 may be formed by sufficiently dispersing a light diffuser 111 into the high-refractive UV hardening transparent resin, coating the high-refractive transparent resin, in which the light diffuser 111 is dispersed, onto one surface of the base material layer 100 by using a flat roll and then hardening the coated high-refractive transparent resin. Here, the coated thickness of the high-refractive UV hardening transparent resin may be about 20 μm to about 30 μm. When the coated thickness exceeds about 30 μm, an excessive amount of diffuser 111 may be contained to increase light scattering, thereby deteriorate light transmittance. When the coated thickness is less than about 20 μm, the coated high-refractive transparent resin typically has a rough surface due to size of the diffuser 111. Thus, it may be difficult to sufficiently secure adhesion force with the film and light diffusion.

According to at least one example embodiment, the high-refractive resin layer 120 may be manufactured by coating the high-refractive transparent resin on one surface of the high-refractive light diffusion layer 110, forming the optical pattern in an imprint on the coated high-refractive transparent resin using a hard mold method and an engraving roll in which the optical pattern is engraved, or a soft mold method using a film in which the optical pattern is engraved, and then hardening the coated high-refractive transparent resin using UV irradiation.

Organic Light-Emitting Device Display Apparatus

Figure 7:
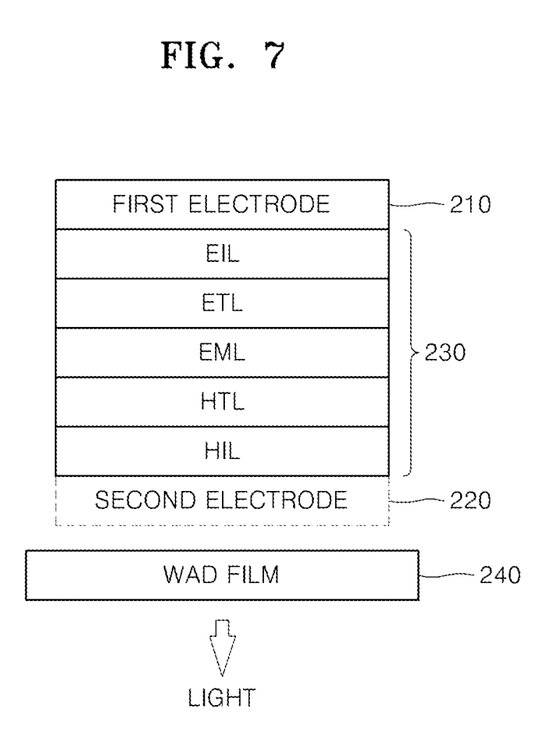
FIG. 7 is a schematic cross-sectional view of an organic light-emitting device display apparatus according to an example embodiment.

FIG. 7 illustrates an organic light-emitting device display apparatus according to an example embodiment.

According to at least one example embodiment, referring to FIG. 7, the organic light-emitting device display apparatus may include a first electrode 210, a second electrode 220 facing the first electrode 210, an organic light emission film 230, and a color display film 240. The organic light emission film 230 may be disposed between the first electrode 210 and the second electrode 220. The color display film 240 may be disposed on a light emission surface of the second electrode 220.

The first electrode 210 may be an anode, and the second electrode 220 may be a cathode. Each of the first and second electrodes 210 and 220 may include a transparent electrode or a reflective electrode.

The organic light emission film 230 may be formed by sequentially stacking a hole injection layer (HIL), a hole transport layer (HTL), an emission layer (EML), an electron transport layer (ETL), and an electron injection layer (EIL).

The organic light-emitting device display apparatus may have a resonant structure to display an image using a color reflected from each pixel of the organic light emission film 230.

Figure 8:
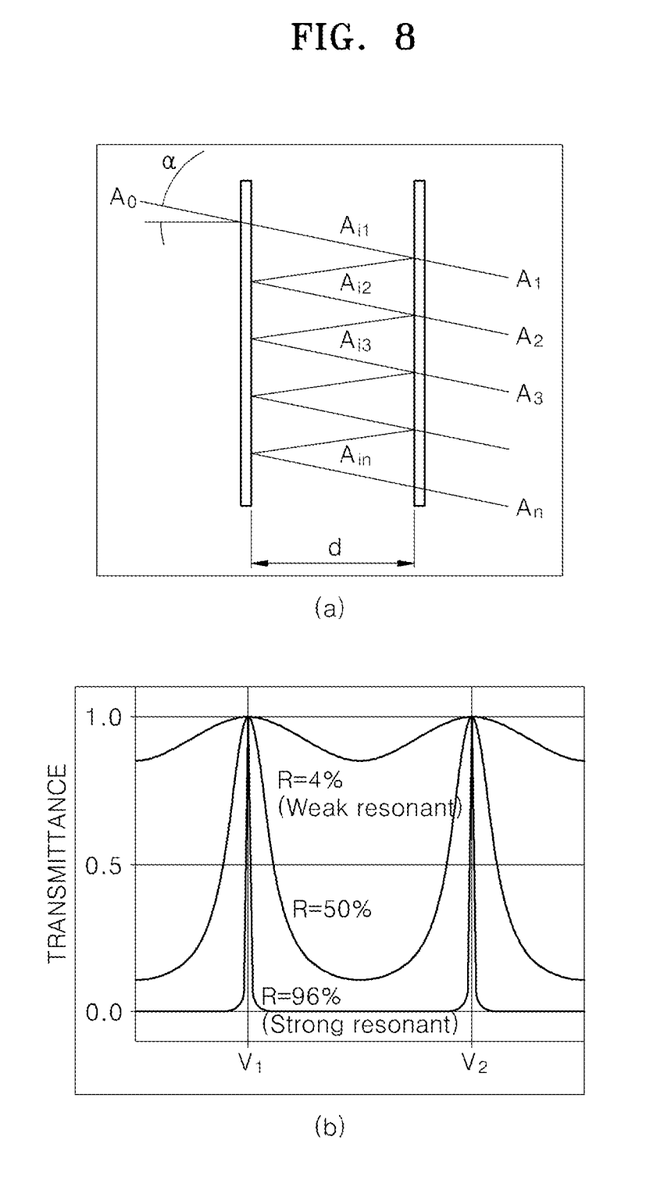
FIG. 8A is a cross-sectional view for explaining a resonant structure.
FIG. 8B is a graph illustrating transmittance distribution according to a light wavelength.

FIG. 8A is an illustrating explaining the resonant structure, and FIG. 8B is a graph illustrating transmittance distribution according to a light wavelength.

Referring to FIG. 7, a structure surrounded by the first and second electrodes 210 and 220 may be defined as a cavity. As illustrated in FIG. 8A, light emitted from the EML may be repeatedly reflected within the cavity between the first and second electrodes 210 and 220. Then, as illustrated in FIG. 8B, the reflection may be continuous to amplify luminescence intensity in a specific wavelength region.

Referring to FIG. 8B, a strong resonant structure may have a very narrow light wavelength region when compared to that of a weak resonant structure. Also, it is seen that a luminescence direction is narrowed as front luminescence intensity increases. That is, the color purity and front brightness may increase, but the viewing angle may be narrowed. Thus, a color shift phenomenon may occur. By the color shift phenomenon, the display that is displayed as a white color at the front side is displayed as a blue-like color as a viewing angle increases. The color shift may be defined as white angle dependency (WAD). To adjust the color shift, the color display film according to an example embodiment may be introduced.

Hereinafter, a composition and effect of the color display film according to an example embodiment will be described in detail with reference to the example embodiments. Since the following embodiments are example embodiments, the example embodiments are not limited to the following description.

Since contents that are not disclosed herein are sufficiently technically known to a person skilled in the art, their descriptions will be omitted.

EMBODIMENTS

Embodiment 1

After the color display film in which respective layers are stacked is manufactured, physical properties of the color display film may be evaluated and expressed in Table 1 below.

Figure 6:
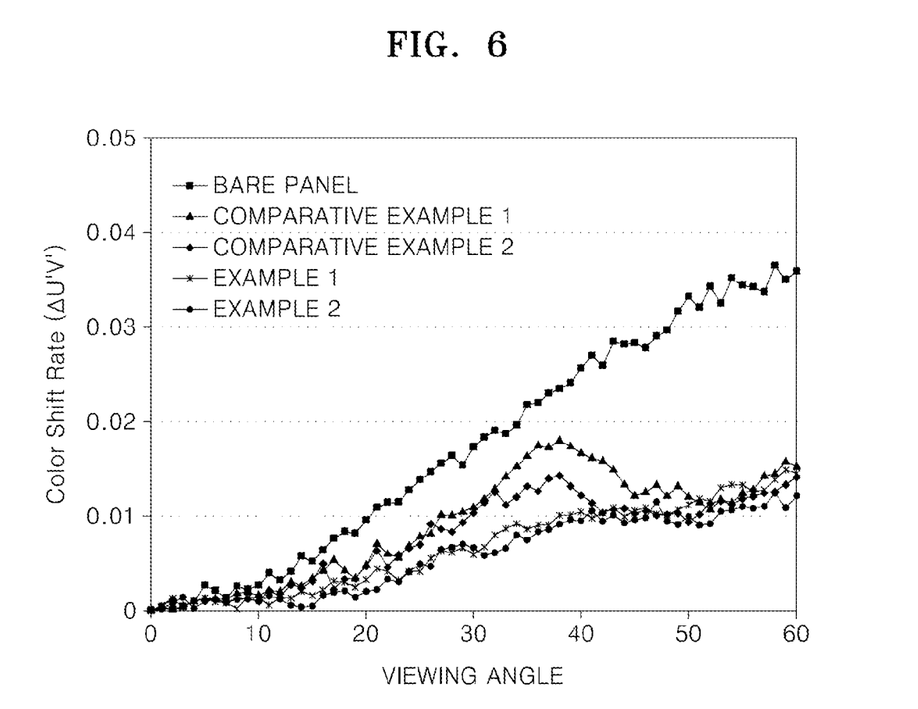
FIG. 6 is a graph illustrating ΔU'V' values according to viewing angles of color display films according to an example embodiment and a comparative example.

Also, ΔU'V' values according to a viewing angle are expressed in the graph of FIG. 6.

Base material layer: a TAC film may be used as the base material layer, and the base material layer may have a thickness of about 60 μm.

High-refractive light diffusion layer: the high-refractive light diffusion layer may be manufactured by using a UV hardening transparent acrylic-based resin containing a light diffuser and may have a refractive index of about 1.52 and a thickness of about 30 μm. silicon-based particles (J company, SL-200, an average diameter size (D50) of about 2 μm) of 3 weight % may be used as the light diffuser.

High-refractive resin layer: the high-refractive resin layer may be manufactured by using a UV hardening transparent acrylic-based resin (A company, RS1400) and may have a refractive index of about 1.52 and a thickness of about 40 μm.

Low-refractive resin layer on which optical pattern is formed: a plurality of semicircular lenticular lenses may be arranged on one surface of the low-refractive resin layer that is manufactured by using a UV hardening transparent acrylic-based resin (S company, SSC-3802) having a refractive index of about 1.39, and the resin layer and a micro lens are integrally formed with each other. The low-refractive resin layer may have a thickness of about 30 μm, and the lenticular lens may have a diameter of about 20 μm, a height of about 20 μm, and an aspect ratio of about 1.0.

Embodiment 2

After the same color display film as that of Embodiment 1, except for about 5 weight % of the light diffuser, is manufactured, physical properties are evaluated and expressed in Table 1 below.

Comparative Example 1

After the same color display film as that of Embodiment 1, except that the high-refractive light diffusion layer does not include the light diffuser, and the lenticular lens has a width of about 20 μm, a height of about 20 μm, and an aspect ratio of about 1.0, is manufactured, physical properties are evaluated and expressed in Table 1 below.

Comparative Example 2

After the same color display film as that of Embodiment 1, except that the high-refractive light diffusion layer does not include the light diffuser, and the lenticular lens has a width of about 20 μm, a height of about 24 μm, and an aspect ratio of about 1.2, is manufactured, physical properties are evaluated and expressed in Table 1 below.

Method for Evaluating Physical Property

Light transmittance (%) and light scattering (%): after the manufactured film is cut by a size of about 5 cm*5 cm, light is incident into a surface that is exposed to the outside of the low-refractive resin layer to measure an amount of incident light by using an equipment of the company on the basis of ASTM D1003 regulations.

Color shift rate (ΔU'V'): after the films according to Embodiments and Comparative Examples are cut by a size of about 20 cm*20 cm, the cut films are attached to an OLED television by a measuring device (EZcontrast (E company)) to measure the color shift rate at an interval of about 1° from about 0° to about 60° with respect to a center of the panel, thereby obtaining a wide spectrum. Values of the color shift rate ΔU'V' to a viewing angle of about 0° are calculated by using the measured results to express the values of the color shift rate ΔU'V' according to the viewing angle as the graph of FIG. 6. A state in which the film is not attached may be a bare panel state.

TABLE 1

|  |  | Embodiment 1 | Embodiment 2 | Comparative Example 1 | Comparative Example 2 |
|---|---|---|---|---|---|
| Refractive index | High-refractive light diffusion layer | 1.52 | 1.52 | — | — |
|  | High-refractive resin layer | 1.52 | 1.52 | 1.52 | 1.52 |
|  | Low-refractive resin layer | 1.39 | 1.39 | 1.39 | 1.39 |
| Lenticular lens aspect ratio (H/D) |  | 1.0 | 1.0 | 1.0 | 1.2 |
| Light diffuser (weight %) |  | 3 | 5 | — | — |
| Light transmittance (%) |  | 93.53 | 93.56 | 94.43 | 94.53 |
| Light scattering (%) |  | 73.31 | 78.10 | 33.67 | 32.05 |
| ΔU'V' | 0° | 0 | 0 | 0 | 0 |
|  | 20° | 0.003 | 0.002 | 0.005 | 0.005 |
|  | 40° | 0.010 | 0.009 | 0.018 | 0.011 |
|  | 60° | 0.015 | 0.012 | 0.015 | 0.014 |

Referring to FIG. 4, according to the measured results of the physical properties, when the color display films are used in Comparative Examples and Embodiments, it is seen that the ΔU'V' value is reduced to improve the color display effect when compared to the color display of the bare panel.

Referring to Table 1, it is seen that the ΔU'V' values of Embodiments 1 and 2 including the light diffuser are reduced when compared to the ΔU'V' values of Comparative Example 1, which does not include the light diffuser.

Also, a heterogeneous resin having a relatively low refractive index difference may be selected, the lens may be easily processed. Furthermore, the production processability may be superior because Embodiments 1 and 2, in which the light diffuser is provided, have equal or lower ΔU'V' values when compared to the values of Comparative Example 2, in which a lenticular lens having a large aspect ratio is used.

The improved color display film according to an example embodiment may have a lower color shift than conventional films according to the viewing angle and superior light transmission and diffusion. Thus, the method for manufacturing the color display film may be superior in processability and economic feasibility.

It should be understood that the exemplary embodiments described therein should be considered in a descriptive sense only and not for purposes of limitation. Descriptions of features within each example embodiment should typically be considered as available for other similar features in other embodiments.

While one or more example embodiments have been described with reference to the figures, it will be understood by those of ordinary skill in the art that various changes in form and details may be made therein without departing from the spirit and scope of the example embodiments as defined by the following claims.

What is claimed is:

1. A color display film comprising:
   a base material layer;
   a high-refractive light diffusion layer comprising a light diffuser;
   a high-refractive resin layer; and
   a low-refractive resin layer on which an optical pattern is formed,
   wherein the base material layer, the high-refractive light diffusion layer, the high-refractive resin layer, and the low-refractive resin layer are in a stacked configuration,
   wherein a refractive index of the high-refractive light diffusion layer or the high-refractive resin layer is greater than a refractive index of the low-refractive resin layer, and
   a surface of the low-refractive resin layer in contact with the high-refractive resin layer includes the optical pattern,
   wherein an upper surface of the low-refractive resin layer is substantially flat, and
   wherein the optical pattern includes:
   a plurality of lenticular lenses; and
   at least one of the plurality of lenticular lenses has a width of 1 μm to 1,000 μm, a height of 1 μm to 2,000 μm, and an aspect ratio of 0.2 to 3.0.

2. The color display film of claim 1, wherein at least one of the high-refractive light diffusion layer and the high-refractive resin layer comprises an ultraviolet hardening transparent resin having a refractive index of 1.50 to 1.60.

3. The color display film of claim 1, wherein the low-refractive resin layer comprises an ultraviolet hardening transparent resin having a refractive index of 1.35 to 1.45.

4. The color display film of claim 1, wherein the optical pattern and the low-refractive resin layer are integrally formed.

5. The color display film of claim 1, wherein the high-refractive light diffusion layer comprising the light diffuser and the high-refractive resin layer are integrally formed.

6. The color display film of claim 1, wherein the plurality of lenticular lenses are spaced apart by a distance, and a ratio of the distance to the width is equal to or less than 3.0.

7. The color display film of claim 1, wherein at least one of the high-refractive resin layer and the low-refractive resin layer comprises an ultraviolet hardening transparent resin having an acrylate-based functional group.

8. The color display film of claim 1, wherein:
   the light diffuser comprises one of an organic-based light diffuser, an inorganic-based light diffuser, and a mixture thereof,
   the organic-based light diffuser comprises at least one of acrylic-based particles, siloxane-based particles, melamine-based particles, polycarbonate-based particles, and styrene-based particles, and
   the inorganic-based light diffuser comprises at least one of calcium carbonate, barium sulfate, titanium dioxide, aluminum hydroxide, silica, glass, talcum, mica, white carbon, magnesium oxide, and zinc oxide.

9. The color display film of claim 8, wherein the organic-based light diffuser has a particle size of 1 μm to 20 μm.

10. The color display film of claim 9, wherein:
    the organic-based light diffuser comprises polymer particles coated with a black dye, and non-coated particles,
    the polymer particles that are coated with the black dye comprise poly methyl methacrylate (PMMA) particles, and
    the non-coated particles comprise one of silicon particles, acrylic-based particles, and a mixture thereof.

11. The color display film of claim 10, wherein the polymer particles coated with the black dye and the non-coated particles are mixed at a weight ratio of 1:4 to 4:1 in the organic-based light diffuser.

12. The color display film of claim 1, wherein the high refractive light diffusion layer contains the light diffuser at a concentration of 0.1 weight % to 10 weight %.

13. The color display film of claim 1, wherein:
    the base material layer has a thickness of 30 μm to 100 μm,
    the high-refractive light diffusion layer has a thickness of 5 μm to 60 μm, the high-refractive resin layer has a thickness of 5 μm to 80 μm, and the low-refractive resin layer has a thickness of 5 μm to 50 μm.

14. The color display film of claim 1, wherein an adhesive layer is stacked on an other surface of the low-refractive resin layer.

15. The color display film of claim 1, wherein the base material layer comprises one of triacetate cellulose (TAC), polyethylene terephthalate (PET), polycarbonate (PC), and polyvinyl chloride (PVC).

16. An organic light-emitting device display apparatus comprising:
    a first electrode;
    a second electrode facing the first electrode;
    an organic light emission film disposed between the first electrode and the second electrode; and
    the color display film of claim 1 disposed on a light emission surface of the second electrode,
    wherein the organic light-emitting device display apparatus has a resonant structure and is configured to display an image by using a color reflected from each pixel of the organic light emission film.

17. The apparatus of claim 16, wherein the organic light emission film comprises a stacked configuration of a hole injection layer (HIL), a hole transport layer (HTL), an emission layer (EML), an electron transport layer (ETL), and an electron injection layer (EIL).

18. A method for manufacturing a color display film, the method comprising:
    forming a high-refractive light diffusion layer by coating a high-refractive transparent resin comprising a light diffuser on one surface of a base material layer, and hardening the resin;
    forming a high-refractive resin layer, in which a plurality of optical patterns are imprinted, on one surface of the high-refractive light diffusion layer; and
    forming a low-refractive resin layer having the optical patterns formed on a surface thereof by coating a low-refractive transparent resin on a surface of the high-refractive resin layer in which the optical patterns are imprinted, and hardening the resin;
    wherein a refractive index of the high-refractive light diffusion layer or the high-refractive resin layer is greater than a refractive index of the low-refractive resin layer; and
    wherein the optical patterns include:
    a plurality of lenticular lenses; and
    at least one of the plurality of lenticular lenses has a width of 1 μm to 1,000 μm, a height of 1 μm to 2,000 μm, and an aspect ratio of 0.2 to 3.0.

19. The method of claim 18, further comprising forming an adhesive layer by coating an adhesive on an other surface of the low-refractive resin layer.

20. The method of claim 18, wherein:
    the high-refractive transparent resin comprises an ultraviolet hardening transparent resin having a refractive index of 1.50 to 1.60, and the low-refractive transparent resin comprises an ultraviolet hardening transparent resin having a refractive index of 1.35 to 1.45.

* * * * *